US007995240B2

(12) United States Patent
Ikeno et al.

(10) Patent No.: US 7,995,240 B2
(45) Date of Patent: Aug. 9, 2011

(54) IMAGE-FORMING DEVICE CAPABLE OF FORMING AND CORRECTING COLOR IMAGE

(75) Inventors: Takahiro Ikeno, Owariasahi (JP); Takeshi Kuno, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 512 days.

(21) Appl. No.: 11/472,467

(22) Filed: Jun. 22, 2006

(65) Prior Publication Data

US 2006/0291881 A1 Dec. 28, 2006

(30) Foreign Application Priority Data

Jun. 22, 2005 (JP) ................................ 2005-182236

(51) Int. Cl.

| | |
|---|---|
| ***H04N 1/60*** | (2006.01) |
| ***H04N 1/40*** | (2006.01) |
| ***G03F 3/08*** | (2006.01) |

(52) U.S. Cl. ........ 358/1.9; 358/3.23; 358/518; 358/519; 358/465

(58) Field of Classification Search .................. 358/296, 358/298, 501, 1.9, 3.23, 518, 519, 465, 401, 358/405, 504, 505, 521, 527, 44, 9, 537, 358/3.1, 3.02; 399/49, 78, 15, 158, 178, 399/182, 321; 382/164, 167, 278, 307

See application file for complete search history.

(56) References Cited

U.S. PATENT DOCUMENTS

| | | | | |
|---|---|---|---|---|
| 5,579,090 A | | 11/1996 | Sasanuma et al. | |
| 5,694,223 A | | 12/1997 | Katori et al. | |
| 6,034,788 A | * | 3/2000 | Sasanuma et al. | 358/406 |
| 6,252,995 B1 | * | 6/2001 | Takamori | 382/254 |
| 6,418,281 B1 | * | 7/2002 | Ohki | 399/49 |

FOREIGN PATENT DOCUMENTS

| | | |
|---|---|---|
| JP | 63113568 | 5/1988 |
| JP | 4077060 | 3/1992 |
| JP | 05-153353 | 6/1993 |
| JP | 5161013 | 6/1993 |
| JP | 6022140 | 1/1994 |

(Continued)

OTHER PUBLICATIONS

Office Action in corresponding Japanese Patent Application No. 2005-182236 mailed Jun. 22, 2010.

*Primary Examiner* — Benny Q Tieu
*Assistant Examiner* — Ngon Nguyen
(74) *Attorney, Agent, or Firm* — Banner & Witcoff, Ltd.

(57) ABSTRACT

An image-forming device includes: an image-forming unit; a sensor; a storing unit; a reference ratio determining unit; an estimated ratio determining unit; and a density correcting unit. The image-forming unit is capable of forming a plurality of density patches corresponding to a plurality of reference densities. The sensor detects the densities of the density patches and outputs a measured output value for each reference density. The storing unit stores reference output values for the reference densities. The reference ratio determining unit determines reference ratios to compensate for differences between the measured output values and the reference output values for the reference densities. The estimated ratio determining unit determines estimated ratios corresponding to densities other than the reference densities based on the reference ratios for the reference densities. The density correcting unit corrects density of image data based on the reference ratios and estimated ratios.

25 Claims, 8 Drawing Sheets

FOREIGN PATENT DOCUMENTS

| | | |
|---|---|---|
| JP | 7203207 | 8/1995 |
| JP | 7264427 | 10/1995 |
| JP | 8251366 | 9/1996 |
| JP | 08-286439 | 11/1996 |
| JP | 9187999 | 7/1997 |
| JP | 10178552 | 6/1998 |
| JP | 10200747 | 7/1998 |
| JP | 2000-350033 | 12/2000 |

* cited by examiner

| RECORDING DENSITY | 51<br>20% | 102<br>40% | 153<br>60% | 204<br>80% | 255<br>100% |
|---|---|---|---|---|---|
| GAMMA OUTPUT | a1 | a2 | a3 | a4 | a5 |
| CALIBRATION GAMMA INPUT | b1 | b2 | b3 | b4 | b5 |
| CALIBRATION GAMMA OUTPUT | c1 | c2 | c3 | c4 | c5 |

| RECORDING DENSITY | 51<br>20% | 102<br>40% | 153<br>60% | 204<br>80% |
|---|---|---|---|---|
| REFERENCE RATIO | c1／a1 | c2／a2 | c3／a3 | c4／a4 |

| 0～50 | 51～204 | 205～255 |
|---|---|---|
| CONSTANT RATIO | SPLINE INTERPOLATION | CONSTANT RATIO |
| $\frac{c1-g}{a1-g}$ | | $\frac{f-c4}{f-a4}$ |

IMAGE-FORMING DEVICE CAPABLE OF FORMING AND CORRECTING COLOR IMAGE

CROSS REFERENCE TO RELATED APPLICATION

This application claims priority from Japanese Patent Application No. 2005-182236 filed Jun. 22, 2005. The entire content of this priority application is incorporated herein by reference.

TECHNICAL FIELD

The invention relates to an image-forming device.

BACKGROUND

In the field of image-forming devices, it has been customary to perform a calibration process in order to maintain image quality. The calibration process is executed in order to prevent changes in the density of toner images that occur through extended use of the device or due to environmental changes. One such calibration process disclosed in Japanese unexamined patent application publication No. HEI-4-77060A entails forming density patches (test patterns), measuring the densities of the density patches, and calibrating image densities in image formation based on these measurements.

This calibration process includes the steps of measuring a plurality of density patches having different densities to produce measured output values, and forming ratio data (calibration data) for offsetting a difference between these measured output values and reference output values. Since numerous values for ratio data are required for each density level within the overall density range, the problem becomes how to acquire so many values of ratio data. In the example of Japanese unexamined patent application publication No. HEI-4-77060A, the image-forming device forms test patterns for all density levels and measures the densities of all these levels. The image-forming device then acquires calibration coefficients for calibrating the input values (measured values) and output values. However, a method of measuring the densities of numerous density levels can slow the process and consumes a lot of developer or other consumables.

SUMMARY

In view of the foregoing, it is an object of the invention to provide an improved image-forming device capable of performing precise calibration while reducing the number of density patches formed for calibration.

In order to attain the above and other objects, the invention provides an image-forming device including: an image-forming unit; a sensor; a storing unit; a reference ratio determining unit; an estimated ratio determining unit; and a density correcting unit. The image-forming unit is capable of forming an image based on image data indicating a density falling within a predetermined density range. A plurality of densities are defined within the density range and a plurality of reference densities are defined among the plurality of densities within the density range. The image-forming unit is capable of forming a plurality of density patches corresponding to the plurality of reference densities. The sensor detects the densities of the density patches formed by the image-forming unit and outputs a measured output value for each reference density. The storing unit stores reference output values for the reference densities. The reference ratio determining unit determines reference ratios to compensate for differences between the measured output values and the reference output values for the reference densities. The estimated ratio determining unit determines estimated ratios corresponding to densities other than the reference densities based on the reference ratios for the reference densities. The density correcting unit corrects density of image data based on the reference ratios and estimated ratios. The density-corrected image data is supplied to the image-forming unit, the image-forming unit forming an image based on the density-corrected image data.

According to another aspect, the invention provides an image-forming method including: controlling an image-forming unit, which is capable of forming an image based on image data indicating a density falling within a predetermined density range, to form a plurality of density patches corresponding to a plurality of reference densities, a plurality of densities being defined within the density range and the plurality of reference densities being defined among the plurality of densities within the density range; detecting the densities of the density patches and obtaining a measured output value for each reference density; determining reference ratios to compensate for differences between the measured output values and predetermined reference output values for the reference densities; determining estimated ratios corresponding to densities other than the reference densities based on the reference ratios for the reference densities; and correcting density of image data based on the reference ratios and estimated ratios and controlling the image-forming unit to form an image based on the density-corrected image data.

According to another aspect, the invention provides a storage medium storing a set of program instructions executable on a data processing device, the instructions including: controlling an image-forming unit, which is capable of forming an image based on image data indicating a density falling within a predetermined density range, to form a plurality of density patches corresponding to a plurality of reference densities, the plurality of reference densities falling within the density range; controlling a sensor to detect the densities of the density patches and to obtain a measured output value for each reference density; determining reference ratios to compensate for differences between the measured output values and predetermined reference output values for the reference densities; determining estimated ratios corresponding to densities other than the reference densities based on the reference ratios for the reference densities; and correcting density of image data based on the reference ratios and estimated ratios and controlling the image-forming unit to form an image based on the density-corrected image data.

According to another aspect, the invention provides a computer program recorded on a computer readable recording medium, executable by a computer, including: instructions for controlling an image-forming unit, which is capable of forming an image based on image data indicating a density falling within a predetermined density range, to form a plurality of density patches corresponding to a plurality of reference densities, a plurality of densities being defined within the density range and the plurality of reference densities being defined among the plurality of densities within the density range; instructions for controlling a sensor to detect the densities of the density patches and to obtain a measured output value for each reference density; instructions for determining reference ratios to compensate for differences between the measured output values and predetermined reference output values for the reference densities; instructions for determining estimated ratios corresponding to densities other than the reference densities based on the reference ratios for the reference densities; and instructions for correcting density of image data based on the reference ratios and estimated ratios and controlling the image-forming unit to form an image based on the density-corrected image data.

According to another aspect, the invention provides a correction data modifying device including: a storing unit; a controlling unit; a reference ratio determining unit; an estimated ratio determining unit; and a correction table modifying unit. The storing unit stores a correction table that stores correction output values in correspondence with a plurality of densities defined in a predetermined density range, and stores reference output values for a plurality of reference densities. A plurality of densities are defined within the density range and the plurality of reference densities are defined among the plurality of densities within the density range. The controlling unit corrects the reference densities into correction output values that correspond to the reference densities in the correction table, and controls an image-forming device, which is capable of forming an image based on image data indicating a density falling within the predetermined density range, to form a plurality of density patches for the reference densities based on the corrected reference densities and to detect the densities of the density patches and output a measured output value for each reference density The reference ratio determining unit determines reference ratios to compensate for differences between the measured output values and the reference output values for the reference densities. The estimated ratio determining unit determines estimated ratios corresponding to densities other than the reference densities based on the reference ratios for the reference densities. The correction table modifying unit modifies the correction table by modifying the correction output values for the reference densities based on the reference ratios and by modifying the correction output values for densities other than the reference densities in the density range based on the estimated ratios.

According to another aspect, the invention provides a correction data modifying method including: using a correction table to correct reference densities into correction output values that correspond to the reference densities in the correction table, the correction table storing correction output values in correspondence with a plurality of densities defined in a predetermined density range, the plurality of reference densities being defined among the plurality of densities; controlling an image-forming device, which is capable of forming an image based on image data indicating a density falling within the predetermined density range, to form a plurality of density patches for the reference densities based on the corrected reference densities; detecting the densities of the density patches and obtaining a measured output value for each reference density; determining reference ratios to compensate for differences between the measured output values and predetermined reference output values for the reference densities; determining estimated ratios corresponding to densities other than the reference densities based on the reference ratios for the reference densities; and modifying the correction table by modifying the correction output values for the reference densities based on the reference ratios and by modifying the correction output values for densities other than the reference densities in the density range based on the estimated ratios.

According to another aspect, the invention provides a storage medium storing a set of program instructions executable on a data processing device, the instructions including: using a correction table to correct reference densities into correction output values that correspond to the reference densities in the correction table, the correction table storing correction output values in correspondence with a plurality of densities defined in a predetermined density range, the plurality of reference densities being defined among the plurality of densities; controlling an image-forming device, which is capable of forming an image based on image data indicating a density falling within the predetermined density range, to form a plurality of density patches for the reference densities based on the corrected reference densities; controlling a sensor to detect the densities of the density patches and to output a measured output value for each reference density; determining reference ratios to compensate for differences between the measured output values and predetermined reference output values for the reference densities; determining estimated ratios corresponding to densities other than the reference densities based on the reference ratios for the reference densities; and modifying the correction table by modifying the correction output values for the reference densities based on the reference ratios and by modifying the correction output values for densities other than the reference densities in the density range based on the estimated ratios.

According to another aspect, the invention provides a computer program recorded on a computer readable recording medium, executable by a computer, including: instructions for using a correction table to correct reference densities into correction output values that correspond to the reference densities in the correction table, the correction table storing correction output values in correspondence with a plurality of densities defined in a predetermined density range, the plurality of reference densities being defined among the plurality of densities; instructions for controlling an image-forming device, which is capable of forming an image based on image data indicating a density falling within the predetermined density range, to form a plurality of density patches for the reference densities based on the corrected reference densities; instructions for controlling a sensor to detect the densities of the density patches and to output a measured output value for each reference density; instructions for determining reference ratios to compensate for differences between the measured output values and predetermined reference output values for the reference densities; instructions for determining estimated ratios corresponding to densities other than the reference densities based on the reference ratios for the reference densities; and instructions for modifying the correction table by modifying the correction output values for the reference densities based on the reference ratios and by modifying the correction output values for densities other than the reference densities in the density range based on the estimated ratios.

BRIEF DESCRIPTION OF THE DRAWINGS

Illustrative aspects in accordance with the invention will be described in detail with reference to the following figures wherein.

DETAILED DESCRIPTION

Figure 1:
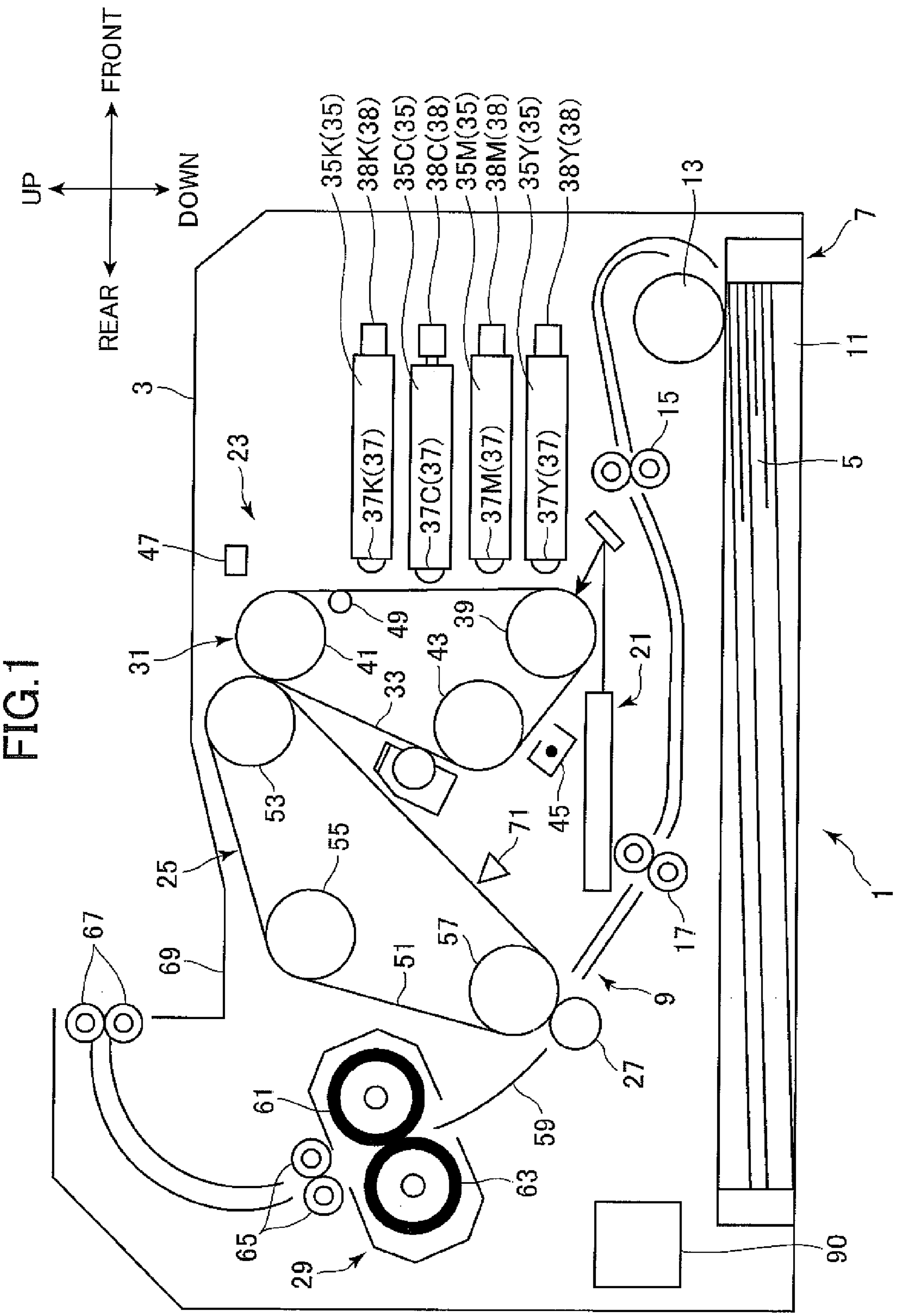
FIG. 1 is a cross-sectional view illustrating primary components of a color laser printer according to an illustrative aspect of the invention.

An image-forming device according to some aspects of the invention will be described while referring to the accompanying drawings wherein like parts and components are designated by the same reference numerals to avoid duplicating description.

1. Overall Structure

FIG. 1 shows a color laser printer 1 of a four-cycle type according to an illustrative aspect of the invention.

The terms “upward”, “downward”, “upper”, “lower”, “above”, “below”, “beneath”, “right”, “left”, “front”, “rear” and the like will be used throughout the description assuming that the laser printer 1 is disposed in an orientation in which it is intended to be used. In use, the laser printer 1 is disposed as shown in FIG. 1.

As shown in FIG. 1, the color laser printer 1 has a main case 3 inside of which are a paper supply unit 7 for supplying paper 5, and an image forming unit 9 for forming an image on the supplied paper 5.

The paper supply unit 7 includes a paper tray 11 for storing a stack of paper 5, a supply roller 13 that contacts the top sheet of paper 5 in the paper tray 11 and rotates to supply one sheet at a time to the image forming unit 9, and transportation rollers 15 and registration rollers 17 for conveying the paper 5 to an image formation position.

The image formation position is a transfer position where a toner image on an intermediate transfer belt 51 further described below is transferred to the paper 5, and is a position where the intermediate transfer belt 51 contacts a transfer roller 27 described below.

The image forming unit 9 includes a scanner unit 21, a processing unit 23, an intermediate transfer belt assembly 25, the transfer roller 27, and a fixing unit 29.

Located in the center portion of the main case 3, the scanner unit 21 has a laser unit, a polygon mirror, and a plurality of lenses and reflection mirrors (not shown). The laser beam emitted from the laser unit based on the image data is passed or reflected by the polygon mirror, reflection mirrors, and lenses in the scanner unit 21 to scan the surface of an organic photoconductor (OPC) belt 33 in a belt photoconductor assembly 31 at high speed.

The processing unit 23 includes the belt photoconductor assembly 31 and a plurality of (four) developer cartridges 35. The four developer cartridges 35, that is, the yellow developer cartridge 35Y holding yellow toner, the magenta developer cartridge 35M holding magenta toner, the cyan developer cartridge 35C holding cyan toner, and the black developer cartridge 35K holding black toner, are disposed at the front inside the main case 3 sequentially in series from bottom to top with a specific vertical gap between the adjacent cartridges.

Each of the developer cartridges 35 includes a developer roller 37 (yellow developer roller 37Y, magenta developer roller 37M, cyan developer roller 37C, and black developer roller 37K), a film thickness regulation blade (not shown), a supply roller, and a toner compartment. The developer cartridges 35 are moved horizontally to contact and separate from the surface of the OPC belt 33 by means of respective separation solenoids 38 (yellow separation solenoid 38Y, magenta separation solenoid 38M, cyan separation solenoid 38C, and black separation solenoid 38K).

The developer rollers 37 have a metal roller shaft covered with a roller made from an elastic material, specifically a conductive rubber material. During development, a specific developer bias relative to the OPC belt 33 is applied to the developer roller 37, and a specific recovery bias is applied during toner recovery.

A nonmagnetic single component spherical polymer toner with a positively charging nature is stored in the toner compartment of each developer cartridge 35 as the developer of the respective color (yellow, magenta, cyan, black). During development, the toner is supplied by rotation of the supply roller to the developer roller 37, and is positively charged by friction between the supply roller and developer roller 37. The toner supplied to the developer roller 37 is carried by rotation of the developer roller 37 between the film thickness regulation blade and the developer roller 37, is further sufficiently charged therebetween, and is thus held on the developer roller 37 as a thin layer of a constant thickness. A reverse bias is applied to the developer roller 37 during toner recovery to recover the toner from the OPC belt 33 to the toner compartment.

The belt photoconductor assembly 31 includes a first OPC belt roller 39, a second OPC belt roller 41, a third OPC belt roller 43, the OPC belt 33 wound around the first OPC belt roller 39, the second OPC belt roller 41, and the third OPC belt roller 43, an OPC belt charger 45, a potential (voltage) applying unit 47, and a potential (voltage) gradient controller 49.

The intermediate transfer belt assembly 25 is disposed behind the belt photoconductor assembly 31, and includes a first ITB roller 53, second ITB roller 55, third ITB roller 57, and the intermediate transfer belt 51 wound around the outside of the first to third ITB rollers 53 to 57. The first ITB roller 53 is located substantially opposite the second OPC belt roller 41 with the OPC belt 33 and intermediate transfer belt 51 therebetween. The second ITB roller 55 is located diagonally lower than and behind the first ITB roller 53. The third ITB roller 57 is located behind the second ITB roller 55 and opposite the transfer roller 27 with the intermediate transfer belt 51 therebetween.

When the first ITB roller 53 is rotationally driven via drive gears by driving a main motor 96 (to be described with reference to FIG. 2), the second ITB roller 55 and third ITB roller 57 follow, and the intermediate transfer belt 51 thus moves circularly clockwise around the first to third ITB rollers 53 to 57.

A density detection sensor 71 including a phototransistor is provided for detecting density of each color on the intermediate transfer belt 51.

The transfer roller 27 is rotationally supported opposite the third ITB roller 57 of the intermediate transfer belt assembly 25 with the intermediate transfer belt 51 therebetween, and includes a conductive rubber roller covering a metal roller shaft. The transfer roller 27 is movable between a standby position where the transfer roller 27 is separated from the intermediate transfer belt 51, and a transfer position where the transfer roller 27 contacts the intermediate transfer belt 51, by a transfer roller separation mechanism (not shown). The transfer roller separation mechanism is disposed on both sides of the paper 5 transportation path 59 in the widthwise direction of the paper 5, and presses the paper 5 conveyed through the transportation path 59 to the intermediate transfer belt 51 when set to the transfer position.

The transfer roller 27 is set to the standby position while visible images of each color are sequentially transferred to the intermediate transfer belt 51, and is set to the transfer position when all of the images have been transferred from the OPC belt 33 to the intermediate transfer belt 51 and a full-color image has thus been formed on the intermediate transfer belt 51. The transfer roller 27 is also set to the standby position during a calibration process described later.

When in the transfer position, a specific transfer bias relative to the intermediate transfer belt 51 is applied to the transfer roller 27 by a transfer bias application circuit (not shown).

The fixing unit 29 is located behind the intermediate transfer belt assembly 25, and includes a heat roller 61, a pressure roller 63 for pressing the heat roller 61, and a pair of transportation rollers 65 disposed downstream from the heat roller 61 and pressure roller 63. The heat roller 61 has an outside layer of silicone rubber covering an inside metal layer, and a halogen lamp as the heat source.

The printing operation of the color laser printer 1 is described next. The following operations are performed by a control unit 90 to be described later controlling other devices of the color laser printer 1.

The supply roller 13 applies pressure to the top sheet of paper 5 stored in the paper tray 11 of the paper supply unit 7 such that rotation of the supply roller 13 delivers the paper 5 one sheet at a time into the paper transportation path. The paper 5 is then supplied to the image formation position by the transportation rollers 15 and registration rollers 17. The registration rollers 17 register the position of the paper 5.

After the surface of the OPC belt 33 is uniformly charged by the OPC belt charger 45, the OPC belt 33 is exposed by high speed scanning of the laser beam from the scanner unit 21 based on image data to be printed. Because the charge is removed from the exposed areas, an electrostatic latent image having positively charged parts and uncharged parts is formed on the surface of the OPC belt 33 according to the image data.

The first OPC belt roller 39 and third OPC belt roller 43 also supply current to the base layer of the OPC belt 33 in contact therewith, and thus hold the potential of the contact area to ground.

The yellow separation solenoid 38Y then moves the yellow developer cartridge 35Y of the plural developer cartridges 35 horizontally to the rear towards the OPC belt 33 on which the electrostatic latent image is formed (i.e., to the left in FIG. 1) so that the developer roller 37 of the yellow developer cartridge 35Y contacts the OPC belt 33 on which the electrostatic latent image is formed.

The yellow toner in the yellow developer cartridge 35Y is positively charged, and thus adheres only to the uncharged areas of the OPC belt 33. A visible yellow image is thus formed on the OPC belt 33.

The magenta developer cartridge 35M, cyan developer cartridge 35C, and black developer cartridge 35K are each moved horizontally towards the front, that is, away from the OPC belt 33, by the respective separation solenoids 38M, 38C, 38K, and are thus separated from the OPC belt 33 at this time.

The visible yellow image formed on the OPC belt 33 is then transferred to the surface of the intermediate transfer belt 51 as the OPC belt 33 moves and contacts the intermediate transfer belt 51.

A forward bias (+300 V potential) is applied by the power supply of the OPC belt charger 45 to the second OPC belt roller 41 at this time, thereby charging the photosensitive layer of the belt near the second OPC belt roller 41 to a +300 V potential through the intervening conductive base layer. This produces a repulsive force between the positively charged yellow toner and the photosensitive layer, and facilitates transferring the toner to the intermediate transfer belt 51.

An electrostatic latent image is likewise formed for magenta on the OPC belt 33, a visible magenta toner image is then formed, and the visible magenta toner image is transferred to the intermediate transfer belt 51 as described above.

More specifically, an electrostatic latent image is formed on the OPC belt 33 for the magenta image component, and the magenta developer cartridge 35M is moved horizontally by the magenta separation solenoid 38M to the back so that the developer roller 37 of the magenta developer cartridge 35M contacts the OPC belt 33. At the same time, the yellow developer cartridge 35Y, cyan developer cartridge 35C, and black developer cartridge 35K are moved horizontally to the front by the respective separation solenoids 38Y, 38C, 38K and thus separated from the OPC belt 33. As a result a visible magenta toner image is formed on the OPC belt 33 by the magenta toner stored in the magenta developer cartridge 35M. As described above, when the OPC belt 33 moves so that the magenta image is opposite the intermediate transfer belt 51, the magenta toner image is transferred to the intermediate transfer belt 51 over the previously transferred yellow toner image.

The same operation is then repeated for the cyan toner stored in the cyan developer cartridge 35C and the black toner stored in the black developer cartridge 35K, thereby forming a full-color image on the intermediate transfer belt 51.

The full-color image formed on the intermediate transfer belt 51 is then transferred at once to the paper 5 by the transfer roller 27 set to the transfer position as the paper 5 passes between the intermediate transfer belt 51 and transfer roller 27.

The heat roller 61 of the image forming unit 9 then thermally fixes the full-color image transferred to the paper as the paper 5 passes between the heat roller 61 and pressure roller 63.

The pair of transportation rollers 65 then convey the paper 5 on which the full-color image has been fixed by the fixing unit 29 to a pair of discharge rollers 67. The discharge rollers 67 then discharge the paper 5 conveyed thereto onto a discharge tray formed on the top of the main case 3. The color laser printer 1 thus prints a full-color image onto the paper.

2. Electrical Structure of the Laser Printer

Figure 2A:
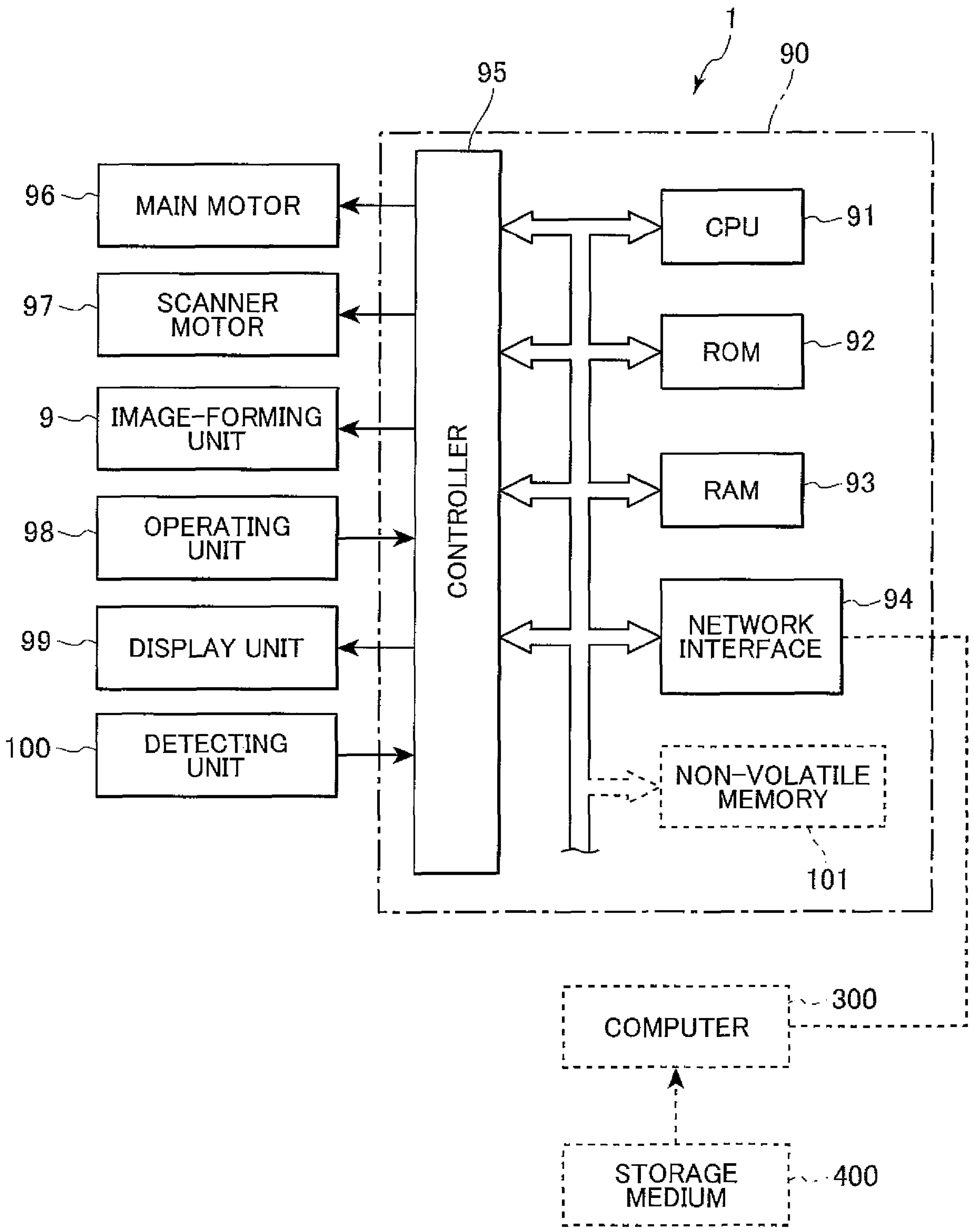
FIG. 2A is a block diagram showing an electrical structure of the color laser printer in FIG. 1.

Next, the electrical structure of the laser printer 1 will be described. FIG. 2A is a block diagram conceptually illustrating the electrical structure of the laser printer 1.

As shown in FIG. 2A, the control unit 90 of the laser printer 1 includes a CPU 91, a ROM 92, a RAM 93, and a network interface 94 and controls various components of the laser printer 1 via a controller 95 configured of an Application Specific Integrated Circuit (ASIC). The controller 95 is also electrically connected to the main motor 96, a scanner motor 97, the image-forming unit 9, an operating unit 98 configured of an input panel or the like, a display unit 99 configured of various lamps or the like, and a detecting unit 100 configured of various sensors and the like. These components constitute the control system of the laser printer 1.

The CPU 91 is connected to the ROM 92, RAM 93, and network interface 94 and functions to control various components in the laser printer 1 via the controller 95 while storing processing results in the RAM 93 according to a procedure stored in the ROM 92.

The main motor 96 drives the second photosensitive belt roller 41 and the first intermediate transfer belt roller 53 in synchronization. The scanner motor 97 drives the polygon mirror and the like in the scanning unit 21 to rotate.

The CPU 91 controls the driving of the main motor 96 and scanner motor 97 based on a program stored in the ROM 92.

The controller 95 controls the image-forming unit 9 according to commands received from the CPU 91. More specifically, the controller 95 controls components in the scanning unit 21 to expose the surface of the photosensitive belt 33, controls a transfer bias applied for transferring toner from the intermediate transfer belt 51 to the paper 5, and the like.

The network interface 94 functions to link the control unit 90 to a personal computer or other external device.

The detecting unit 100 is configured of the density sensor 71 described above and various other sensors. These sensors are electrically connected to the controller 95.

Figure 2B:
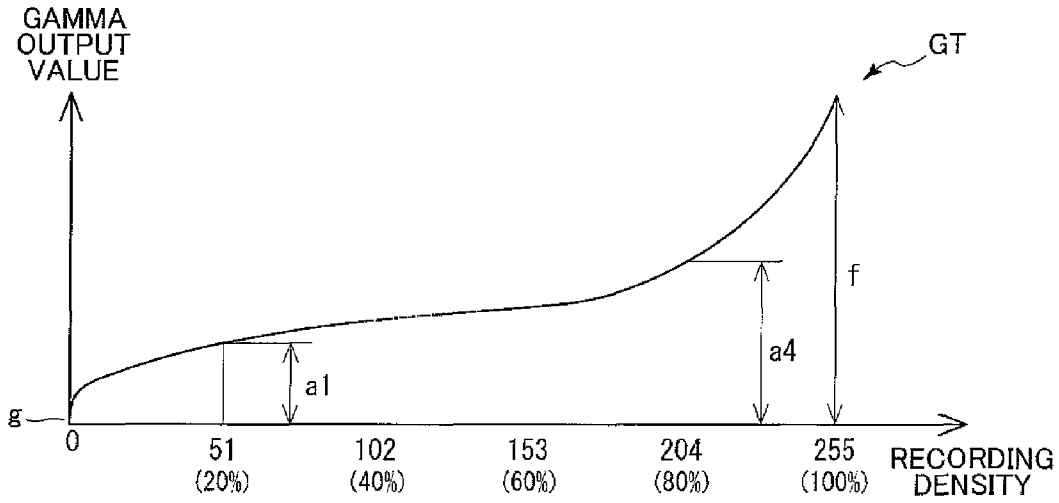
FIG. 2B shows a gamma table.

A gamma table GT is stored for each color in the ROM 92. As shown in FIG. 2B, the gamma table GT for each color stores gamma output values in one to one correspondence with 256 recording density values 0-255. It is noted that the gamma output value for the recording density value of zero (0) will be referred to as "gamma output value g", and the gamma output value for the recording density value of 255 will be referred to as "gamma output value f" hereinafter. In this example, the gamma output value g is equal to zero (0).

Each gamma output value is an output value that should be provided to the image-forming unit 9 in order to reproduce the corresponding recording density value. More specifically, in order to reproduce an arbitrary recording density value, the recording density value is corrected, by first searching the gamma table GT, selecting one gamma output value that corresponds to the recording density, and then setting the selected gamma output value as a corrected recording density. The image-forming unit 9 reproduces the recording density by adjusting the pulse width of the laser beam and the voltages applied to the developing rollers 37 and the photosensitive belt chargers 45 based on the corrected recording density value.

It is noted that the gamma table GT is determined in the factory prior to shipping of the laser printer 1, and is stored in the ROM 92. When the laser printer 1 is turned ON, the gamma table GT is copied into the RAM 93.

Among all the 256 recording density values 0-255, five recording densities of 51 (20%), 102 (40%), 153 (60%), 204 (80%), and 255 (100%) are defined as reference densities.

The laser printer 1 is configured to perform a patch printing-and-detecting process. Next, this patch printing-and-detecting process will be described with reference to FIG. 2C.

Figure 2D:
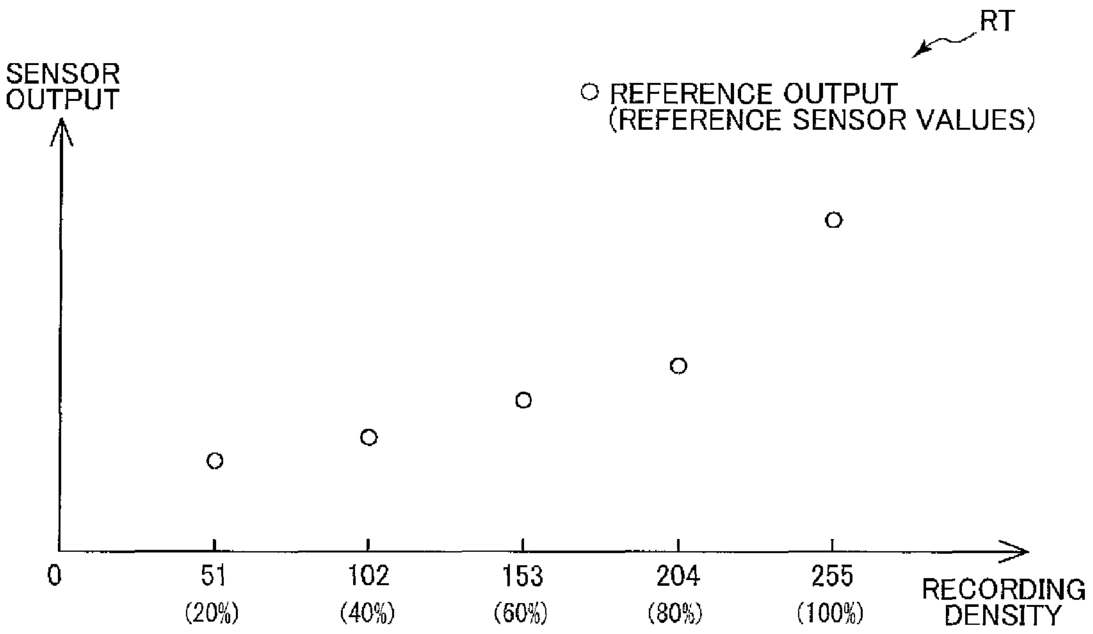
FIG. 2D shows a reference table.
Figure 2C:
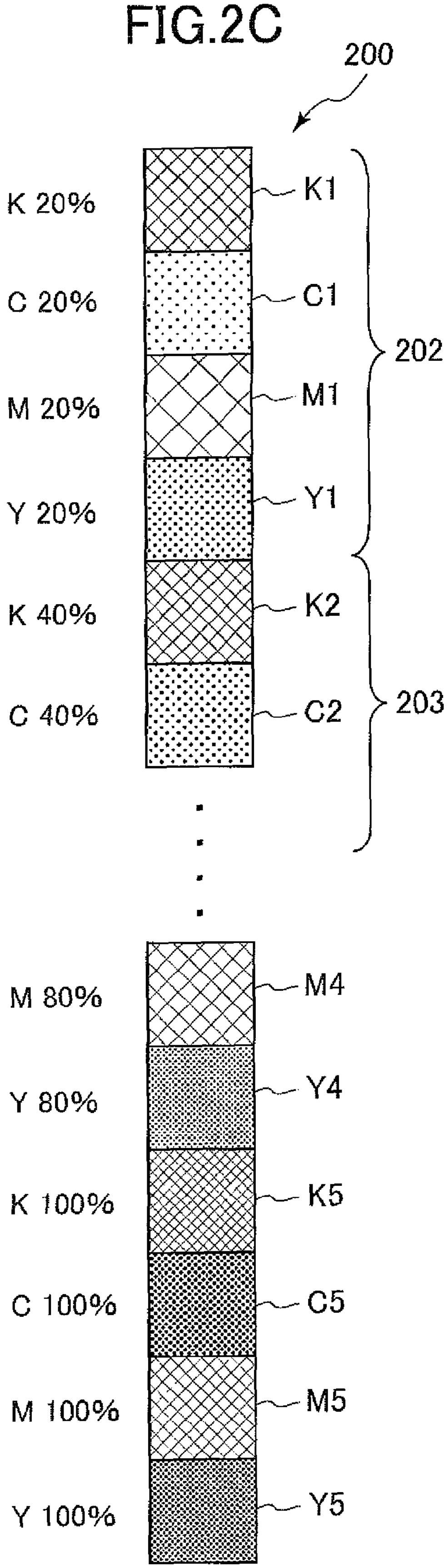
FIG. 2C is an explanatory diagram showing sample density patches used in a patch printing-and-detecting process.

The CPU 91 controls the image-forming unit 9 to form a patch array 200 such as that shown in FIG. 2C on the intermediate transfer belt 51. This patch array 200 is configured of a combination of density patches formed separately for each color. More specifically, the patch array 200 includes black density patches K1, K2, K3, K4, and K5; cyan density patches C1, C2, C3, C4, and C5; magenta density patches M1, M2, M3, M4, and M5; and yellow density patches Y1, Y2, Y3, Y4, and Y5 that are arranged in five sets, including a first set 202 configured of density patches K1, C1, M1, and Y1; a second set 203 configured of density patches K2, C2, M2, and Y2;

The density patches are formed at the reference densities of 51 (20%), 102 (40%), 153 (60%), 204 (80%), and 255 (100%). More specifically, the values of the reference densities 51 (20%), 102 (40%), 153 (60%), 204 (80%), and 255 (100%) are corrected by using the gamma table GT, and then the pulse width of the laser beam and the voltages applied to the developing rollers 37 and the photosensitive belt chargers 45 are adjusted based on the values of the corrected reference densities. As a result, the density patches are formed on the intermediate transfer belt 51 as shown in FIG. 2C.

After the patch array 200 is formed on the intermediate transfer belt 51, the density of each patch in the patch array 200 is measured by the density sensor 71. Here, the density sensor 71 measures densities in the patch array 200 formed on the intermediate transfer belt 51 as the intermediate transfer belt 51 is moved circularly. Since the patch array 200 falls within one circuit of the intermediate transfer belt 51, the density sensor 71 can measure the densities of all patches in the patch array 200 while the intermediate transfer belt 51 moves in one circuit. The density sensor 71 outputs a measured output value (sensor value) for each reference density in each color. Accordingly, five measured output values (sensor values) are obtained for each color.

The ROM 92 stores a reference table RT. As shown in FIG. 2D, the reference table RT stores reference output values in one to one correspondence with the reference densities of 51 (20%), 102 (40%), 153 (60%), 204 (80%), and 255 (100%). It is noted that the reference table RT is determined in the factory prior to shipping of the laser printer 1 with consideration for the properties of the product 1. More specifically, the above-described patch printing-and-detecting process is executed, prior to shipping of the laser printer 1, to produce the patch array 200 by using the gamma table GT and to detect densities of the density patches in the patch array 200. The detected sensor values are stored as the reference output values in the reference table RT.

3. Gamma Table Calibration Process

The laser printer 1 is configured to perform a calibration process for calibrating the gamma table GT. This calibration process is executed after a user purchases the laser printer 1. The calibration process may be executed when the user desires. The calibration process may be executed every time when a predetermined amount of pages have been printed. The calibration process may be executed at other timings.

Next, this calibration process will be described while referring to the flowchart in FIG. 3.

First, in S100 the CPU 91 acquires various settings required for performing the calibration process. More specifically, the CPU 91 reads the reference output values from the reference table RT (FIG. 2D). The CPU 91 also reads the gamma output values for the reference densities 51 (20%), 102 (40%), 153 (60%), 204 (80%), and 255 (100%) from the gamma table GT (FIG. 2B). The thus read gamma output values for the reference densities will be hereinafter referred to as gamma output values "a1-a5" as shown in FIG. 5.

Next in S110 the CPU 91 executes the patch printing-and-detecting process to print the patch array 200 by using the gamma table GT and to acquire current sensor values (measured output values) for the respective density patches (reference recording densities) in the patch array 200.

The acquired measured output values (current sensor values) are stored in the RAM 93 as the measurement results. FIG. 4 is a graph showing an example of the measured output values (current sensor values) for the reference recording density values. In FIG. 4, the reference output values (reference sensor values) from the reference table RT are also shown. As apparent from FIG. 4, the measured output values (current sensor values) fall below the reference output values.

Figures 4, 5, 6:
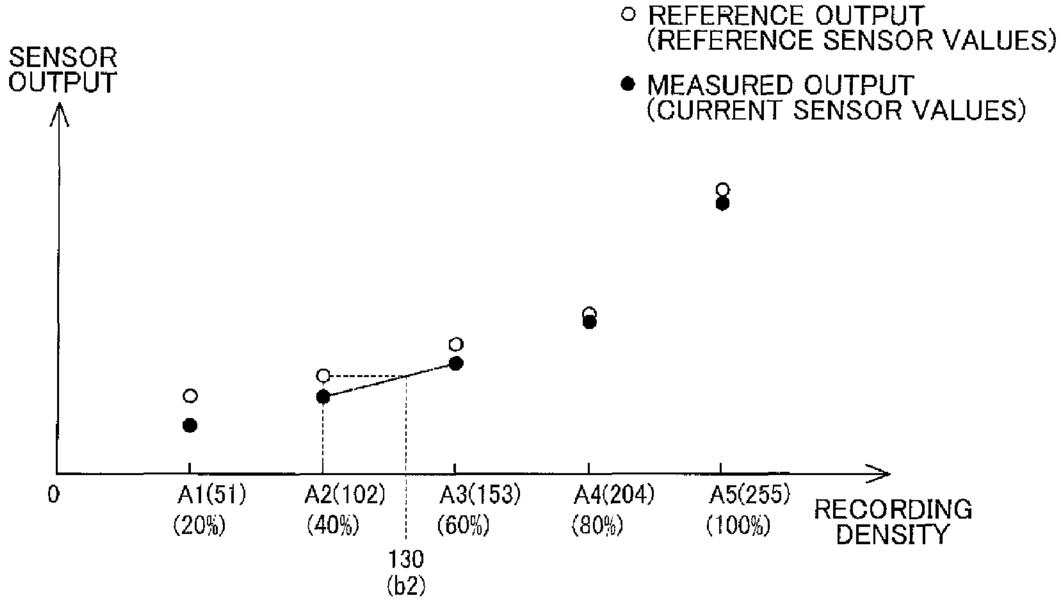
FIG. 4 is a graph showing a relationship between current sensor output values and reference sensor output values.
FIG. 5 is a table showing the current gamma output values, calibration gamma input values, and calibration gamma output values for reference densities.
FIG. 6 is a table showing reference ratios for the reference densities.

In S120 the CPU 91 calculates, through linear interpolation, calibration gamma input values b1-b5 (FIG. 5) that are known from the graph of FIG. 4 as those recording density values that can acquire sensor values that are equal to the reference sensor values for the reference densities 51 (20%), 102 (40%), 153 (60%), 204 (80%), and 255 (100%).

More specifically, the CPU 91 calculates the recording density values whose corresponding current gamma output values should be used to produce sensor values equivalent to the reference output values. In other words, the CPU 91 finds recording density values that are estimated to produce sensor values equivalent to the reference output values for the reference densities 51 (20%), 102 (40%), 153 (60%), 204 (80%), and 255 (100%), and sets these recording density values as the calibration gamma input values "b1-b5". In the example of FIG. 4, the sensor output value that will be obtained when the recording density value is 130 is estimated to be equivalent to the reference output value for the reference density 40% (recording density value 102). Hence, the recording density value of 130 is set as the calibration gamma input value b2 for the recording density value 102 (40%).

In S130 the CPU 91 determines calibration gamma output values "c1-c5" (FIG. 5) based on the gamma table GT dependently on the calibration gamma input values b1-b5. In this process, the CPU 91 selects gamma output values that are stored in the gamma table GT in correspondence with the calibration gamma input values b1-b5, and sets the selected gamma output values as calibration gamma output values c1-c5 for the respective reference densities 51 (20%), 102 (40%), 153 (60%), 204 (80%), and 255 (100%).

Thus, through the processes of S120 and S130, the calibration gamma input values b1-b5 and the calibration gamma output values c1-c5 are set for the reference densities, for which the gamma output values a1-a5 are stored in the gamma table GT.

In S140 the CPU 91 calculates gamma ratios. First, the CPU 91 calculates ratios of the calibration gamma output values c1-c4 to the gamma output values a1-a4 for the reference densities of 20% (51), 40% (102), 60% (153), and 80% (204) FIG. 6 shows the ratios of calibration gamma output values c1-c4 to the gamma output values a1-a4. The calculated ratios for the reference densities will be referred to as "reference ratios".

Next, estimated ratios are computed based on the reference ratios. In this example, estimated ratios corresponding to densities other than the reference densities are set based on the reference ratios found for the reference densities, as shown in FIG. 6. In this way, ratios are determined for the reference densities and for all densities other than the reference densities. The estimated ratios are computed for three density ranges in a manner described below.

Estimated ratios for the density range of 51 to 204 are determined based on a curve approximation using the reference ratios c1/a1, c2/a2, c3/a3, and c4/a4 found for the four points 51, 102, 153, and 204. In this example, estimated ratios are found for the recording density values of 52 to 101, 103 to 152, and 154 to 204 through curve approximation using a spline function, for example, based on the reference ratios found for the four points 51, 102, 153, and 204. With this configuration, estimated ratios are found using curve approximation for the density range that forms a portion (20 to 80%) of the overall density range (the range from 0 to 100%) Accordingly, this configuration can achieve a smooth approximation that reflects the reference ratios and restrains abrupt variations within this range.

Further, the estimated ratios are set to constant ratios in other density ranges within the overall density range.

More specifically, the estimated ratio is set to a constant ratio within a first density range less than the reference density of 20% that is different from but is the nearest to the minimum density of 0% (that is, the range of recording density values from 0 to 50) and to another constant ratio within a second density range greater than the reference density of 80% that is different from but is the nearest to the maximum density of 100% (that is, the range of recording density values from 205 to 255). In the range near the minimum density, the density changes at a fast rate. Therefore, the constant ratio reflects the gamma output value for the minimum density better than values obtained by interpolating the reference ratios. Similarly, in the range near the maximum density, the density changes at a fast rate. Therefore, the constant ratio reflects the gamma output value for the maximum density better than values obtained by interpolating the reference ratios. Stable density calibration can be achieved by selectively setting ratios based on ranges in this way.

Figure 7A:
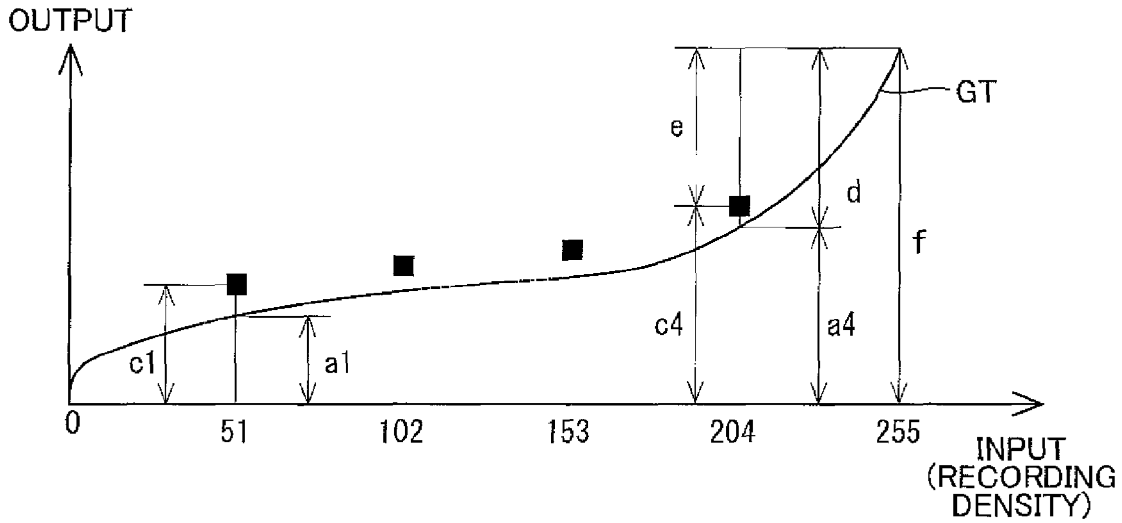
FIG. 7A is a graph showing the relationship between the gamma output values for all the recording densities in the gamma table and calibration gamma output values for the reference densities.

More specifically, as shown in FIG. 6 and FIG. 7A, the estimated ratio for the first density range (0 to 50) is determined based on the gamma output value g for the minimum density 0 (0%). More specifically, the estimated ratio for the first density range is set to a fixed ratio obtained by dividing the difference between the calibration gamma output value c1 and the gamma output value g for the minimum density 0 (0%) by the difference between the gamma output value a1 and the gamma output value g, that is, (c1−g)/(a1−g). In this example, because the gamma output value g for the minimum density is equal to zero (0), the estimated ratio for the first density range (0 to 50) is set equal to the reference ratio c1/a1 for the reference density 20% that is adjacent to this range.

The estimated ratio for the second density range (205 to 255) is determined based on the maximum gamma output value f for the maximum density 255 (100%). More specifically, the estimated ratio for the second density range is set to a fixed ratio obtained by dividing the difference between the gamma output value f for the maximum density 255 (100%) and the calibration gamma output value c4 by the difference between the gamma output value f and the gamma output value a4, that is, (f−c4)/(f−a4).

Thus, a constant estimated ratio is set for the first density range that includes the minimum density 0 (0%) to reflect the gamma output value g (0) for the minimum density 0 (0%), and a constant estimated ratio is set for the second density range that includes the maximum density 255 (100%) to reflect the gamma output value f for the maximum density 255 (100%). In other words, constant estimated ratios are set for the first and second density ranges, where density changes at a fast rate, based on the gamma output values corresponding to those ranges. Therefore, it is possible to reflect the gamma output values in those ranges more accurately than if the estimated ratios were simply set to constant ratios.

Figure 3:
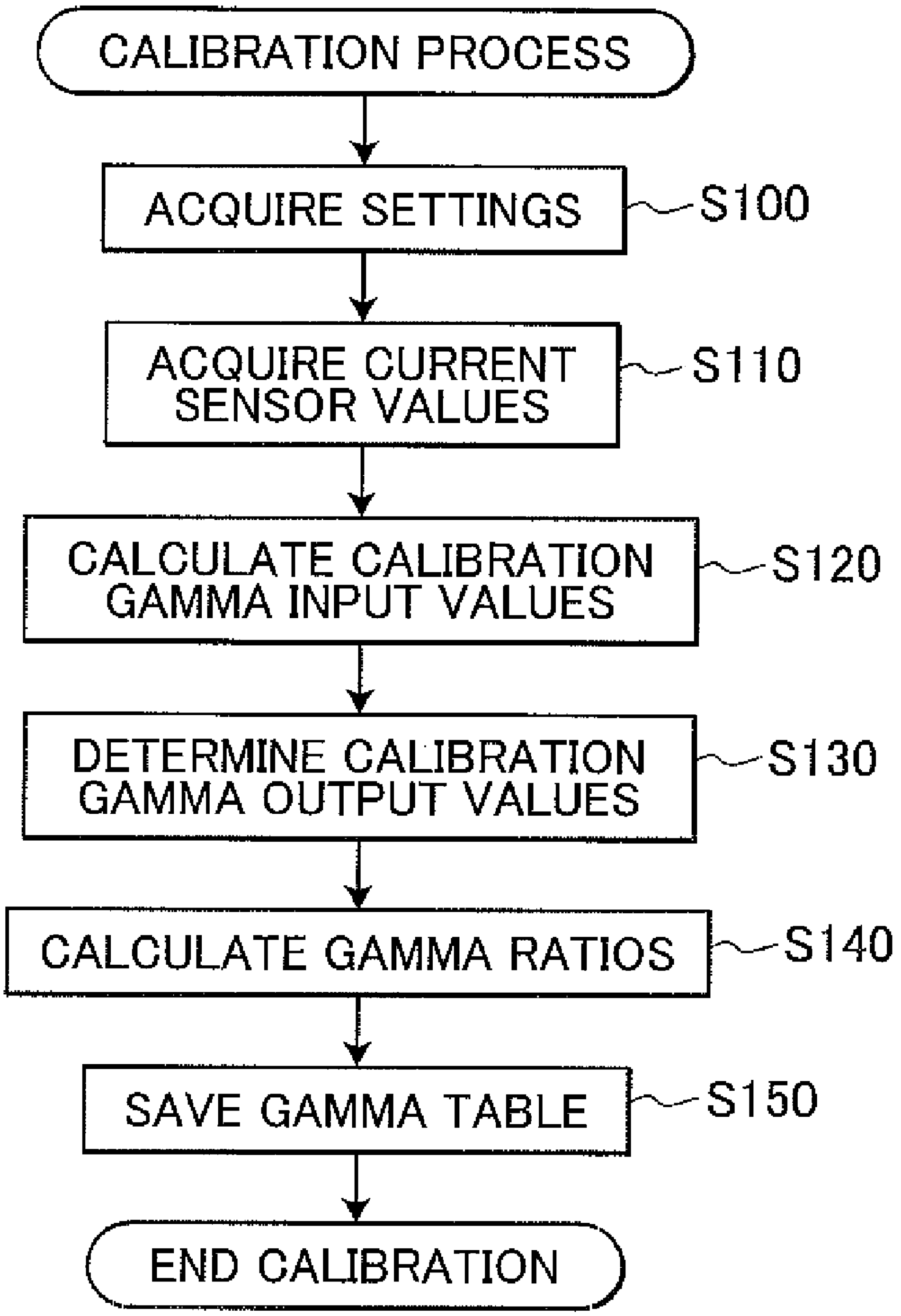
FIG. 3 is a flowchart illustrating steps in a gamma table calibration process.
Figure 7B:
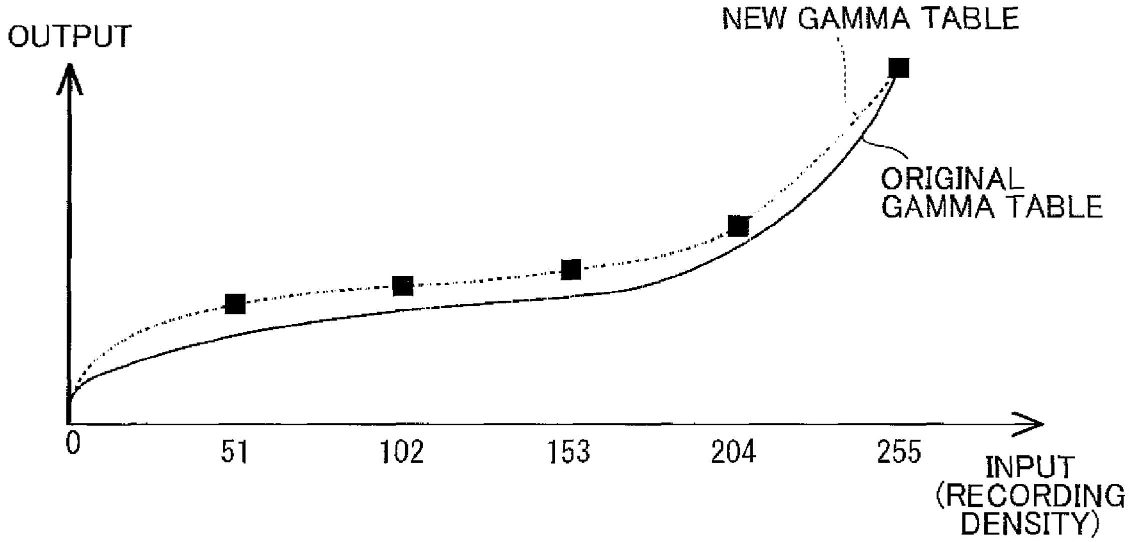
FIG. 7B is a graph showing the relationship, for all the recording density values, between the gamma output values in the original gamma table and new gamma output values in a new gamma table.

Next, the CPU 91 computes and stores a new gamma table in S150 of FIG. 3. The new gamma table is calculated based on the reference ratios and estimated ratios (collectively called gamma ratios) obtained above. Specifically, the new gamma table is calculated by multiplying these gamma ratios by the gamma output values set in the original gamma table GT. Hence, for the range of recording density values 0-50, the gamma output values in the table GT are multiplied by the constant ratio (c1−g)/(a1−g). For the range of recording density values 51-204, the gamma output values in the table GT are multiplied by gamma ratios (the reference ratio and estimated ratio) for the corresponding recording density values. For the recording density values 205-255, the gamma output values in the table GT are multiplied by the constant ratio (f−c4)/(f−a4). Through this process, it is possible to obtain a new gamma table illustrated conceptually by the dotted line in FIG. 7B. This new gamma table is written over the original gamma table GT in the RAM 93. In other words, the original gamma table GT equivalent to the solid line in FIG. 7B is replaced with the new gamma table equivalent to the dotted line in FIG. 7B. The new gamma table is hereafter used for image data correction as the gamma table GT. In other words, the gamma table GT is updated with the new gamma table in the RAM 93.

The laser printer 1 performs a printing process for printing input image data, by using the gamma table GT that is presently being stored in the RAM 93, to reproduce the density of the input image data. Next, this printing process will be described while referring to the flowchart in FIG. 8.

When the CPU 91 of the control unit 90 receives image data indicating recording density of each pixel in an image to be printed (yes in S10), the printing process starts.

Next, in S20, the CPU 91 corrects the recording density of each pixel according to the gamma table GT that is presently being stored in the RAM 93. That is, if the calibration process of FIG. 3 has not yet been executed after the laser printer 1 has been turned ON, the gamma table GT now stored in the RAM 93 is equivalent to the original gamma table GT that is stored in the ROM 92. On the other hand, if the calibration process of FIG. 3 has been already executed after the laser printer 1 has been turned ON, the gamma table GT now stored in the RAM 93 is the new gamma table that has been determined and written over the original gamma table GT during the calibration process. Then, for each pixel, the CPU 91 searches the gamma table GT, selects one gamma output value that corresponds to the subject recording density, and sets the selected gamma output value as a corrected recording density.

Next, in S30, the CPU 91 controls the controller 95 so that the controller 95 controls the image-forming unit 9 to perform a printing process by adjusting, based on the value of the corrected recording density for each pixel, the pulse width of the laser beam and the voltages applied to the developing rollers 37 and the photosensitive belt chargers 45. As a result, the desired image is formed on the intermediate transfer belt 51, and is transferred from the intermediate transfer belt 51 onto a sheet of paper.

As described above, when forming images with the image-forming unit 9 after the gamma table GT has been calibrated to the new gamma table GT, density correction is performed using the new gamma table GT that is obtained based on the reference ratios and estimated ratios. Specifically, before printing image data, image data is corrected in S20 based on the calibrated gamma table GT so that the densities printed on the printing medium match the recording density values in the image data.

Figure 8:
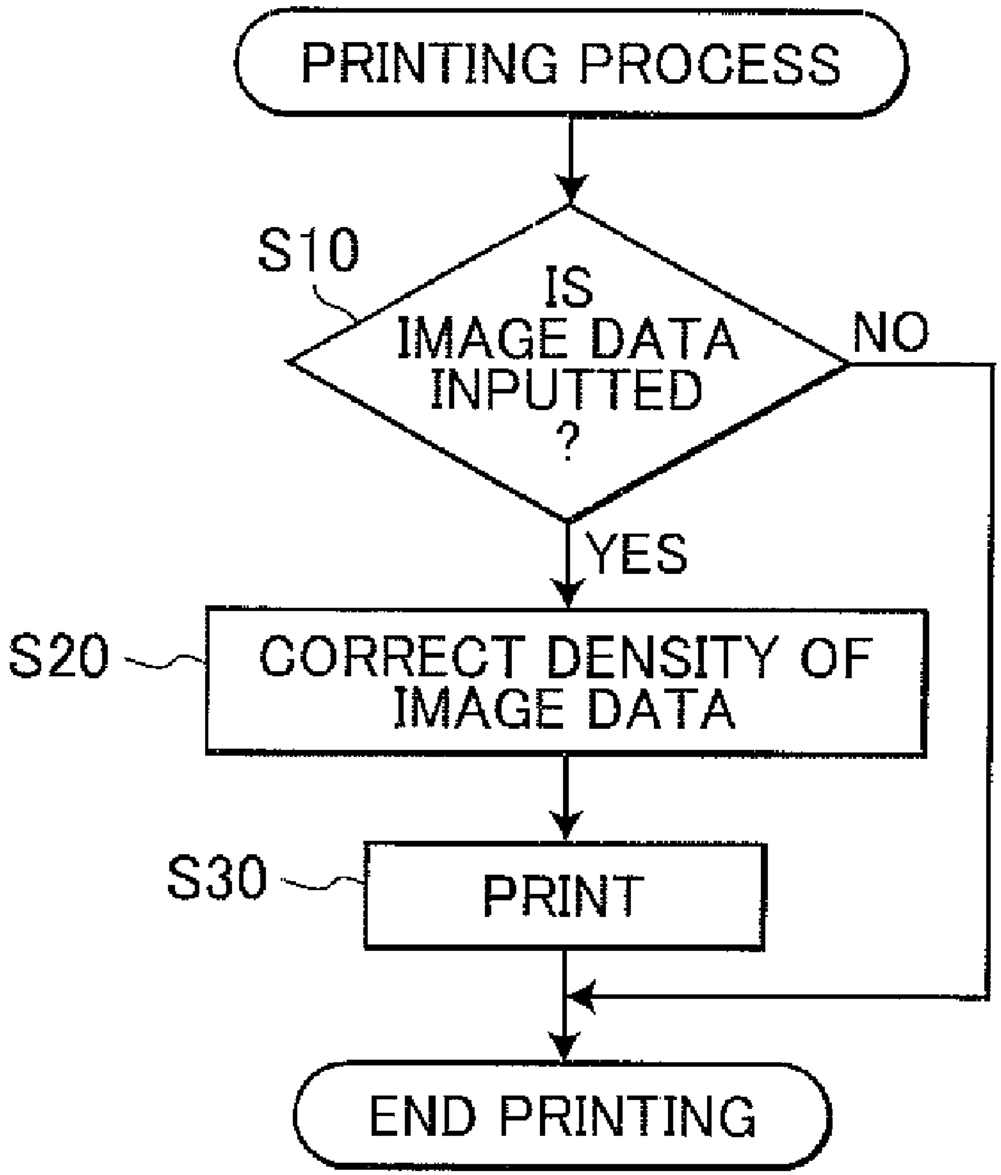
FIG. 8 is a flowchart illustrating steps in a printing process.

Computer programs for performing the processes shown in FIG. 3 and FIG. 8 are stored in the ROM 92. As described above, the program of FIG. 3 includes a process, in which the CPU 91 finds a reference ratio for each reference density that can compensate for the difference between the measured output values and reference output values at each of the reference densities 20%, 40%, 60%, 80%, and 100%; and another process in which the CPU 91 sets estimated ratios for densities other than the reference densities based on the reference ratios for the reference densities found above. The program of FIG. 8 includes a process in which the CPU 91 performs density correction based on the reference ratios and estimated ratios that are now incorporated in the new gamma table GT.

Thus, reference ratios for offsetting the difference between the measured output values and the reference output values are found based on the measured output values obtained for the reference densities and the reference output values for the reference densities. Hence, reference ratios obtained for the reference densities reflect the reference output values and therefore can highly accurately attain density calibration. For densities other than the reference densities, estimated ratios are found based on the reference ratios. Since the estimated ratios are estimated based on the reference ratios, the estimated values reflect the reference output values. In other words, all of the gamma output values that are determined based on the reference ratios and estimated ratios sufficiently reflect the characteristics of the reference output values. Therefore, this gamma output values can be used to perform accurate density correction.

Further, the laser printer 1 finds reference ratios corresponding to the reference densities according to several density patches and acquires estimated ratios using these reference ratios. Therefore, numerous values of calibration data (ratio data) can be found with accuracy while forming only a small number of density patches. In addition, by setting the reference densities at which the density patches are formed at substantially a uniform interval within the overall density range, accurate density correction can be performed while using a small number of density patches.

<Modification>

The control unit 90 may further include a non-volatile memory 101 as indicated by a broken line in FIG. 2A. In this case, prior to shipping of the laser printer 1, the gamma table GT is copied from the ROM 92 to the non-volatile memory 101. Every time when the laser printer 1 is turned ON, the gamma table GT stored in the non-volatile memory 101 is copied into the RAM 93. By repeatedly executing the calibration process of FIG. 3, the gamma table GT stored in the non-volatile memory 101 is updated in succession.

According to the present modification, the gamma table calibration process of FIG. 3 is executed in the same manner as described above except for the points described below.

In S100, the CPU 91 reads the gamma output values for the reference densities from the gamma table GT that is currently being stored in the non-volatile memory 101.

In S110, the CPU 91 executes the patch printing-and-detecting process to print the patch array 200 by using the gamma table GT that is currently being stored in the non-volatile memory 101.

In S130, the CPU 91 selects gamma output values that are stored in the gamma table GT that is now stored in the non-volatile memory 101 in correspondence with the calibration gamma input values b1-b5.

In S150, a new gamma table is calculated by multiplying the gamma ratios determined in S140 by the gamma output values in the gamma table GT that is now stored in the non-volatile memory 101. The thus obtained new gamma table is written over the current gamma table GT that is now stored in the non-volatile memory 101. The new gamma table is written also over the current gamma table GT that is now stored in the RAM 93.

While the invention has been described in detail with reference to the above aspects thereof, it would be apparent to those skilled in the art that various changes and modifications may be made therein without departing from the spirit of the invention.

The color laser printer 1 can be modified to a device other than a color laser printer, such as a monochromatic laser printer.

While density patches are formed on the intermediate transfer belt 51 in the above description, density patches may be formed on an object, other than the intermediate transfer belt 51, such as the photosensitive member, paper, a paper-conveying belt, or the like.

The programs of FIG. 3 and FIG. 8 may be stored in any kind of recording medium that is readable by a computer or other data processing devices.

For example, the program of FIG. 3 may be stored in a recording medium 400 and downloaded to a computer 300 that is connected to the network interface 94 as indicated by a broken line in FIG. 2A. The computer 300 stores a copy of the gamma table GT and the reference table RT that are stored in the laser printer 1. The computer 300 executes the process of FIG. 3 by using the copy of the gamma table GT and the reference table RT. In S110, the computer 300 controls the laser printer 1 to print the density patches and to measure the densities of the density patches. The new gamma table GT obtained by the process of FIG. 3 is transferred from the computer 300 to the laser printer 1, whereupon the laser printer 1 can execute the process of FIG. 8 based on the new gamma table GT.

It is noted the program for the processes of S10 and S20 in FIG. 8 may also be stored in the recording medium 400 and downloaded to the computer 300. In this case, the computer 300 executes the processes of S10 and S20 in FIG. 8. The computer 300 transmits the corrected image data to the laser printer 1, whereupon the laser printer 1 executes the process of S30 in FIG. 8 based on the corrected image data.

What is claimed is:

1. An image-forming device comprising:

an image-forming unit capable of forming, for one color, an image based on image data indicating a density falling within a predetermined density range, a plurality of different densities being defined within the density range and a plurality of different reference densities being defined among the plurality of densities within the density range, the image-forming unit being capable of forming a plurality of density patches corresponding to the plurality of reference densities;

a sensor detecting the densities of the density patches formed by the image-forming unit and outputting a measured output value for each reference density;

a storing unit storing reference output values for the reference densities;

a reference ratio determining unit determining reference ratios to compensate for differences between the measured output values and the reference output values for the reference densities;

an estimated ratio determining unit determining estimated ratios corresponding to densities other than the reference densities based on the reference ratios for the reference densities; and a density correcting unit correcting density of image data based on the reference ratios and estimated ratios, the density-corrected image data being supplied to the image-forming unit, the image-forming unit forming an image based on the density-corrected image data;

wherein the storing unit further stores a correction table that stores, for the one color, correction output values in correspondence with all the plurality of densities in the density range, wherein the image-forming unit forms the plurality of density patches for the one color based on the plurality of different reference densities by correcting the reference densities into correction output values that correspond to the reference densities in the correction table, wherein the reference ratio determining unit includes:

a correction input value estimating unit that estimates, based on the measured output values and based on the reference output values, correction input values that are assumed to produce the reference output values;

a modified correction output value determining unit that determines, as a modified correction output value for each reference density, a correction output value that corresponds to the estimated correction input value in the correction table; and a ratio calculating unit that sets, as the reference ratio for each reference density, a ratio between the correction output value that corresponds to the subject reference density in the correction table and the modified correction output value that corresponds to the estimated correction input value in the correction table, and wherein the density correcting unit includes:

a correction table modifying unit modifying the correction table by multiplying the correction output value for each reference density by the corresponding reference ratio and multiplying the correction output value for each density other than the reference densities in the density range by the corresponding estimated ratio;

a correcting unit correcting the density of the image data based on the modified correction table, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities; and wherein the estimated ratio determining unit sets the estimated ratios for those densities that are other than the reference densities and that exist within a part of the density range that is defined between the first reference density and the second reference density using a curve approximation based on the reference ratios calculated for the plurality of different reference densities.

2. An image-forming device according to claim 1, wherein the reference densities are set at substantially a uniform interval within the density range.

3. An image-forming device according to claim 1, wherein the estimated ratio determining unit sets a first constant ratio as the estimated ratio for a first density range below the first reference density, and sets a second constant ratio as the estimated ratio for a second density range above the second reference density.

4. An image-forming device according to claim 3, wherein the correction output values include a first correction output value in correspondence with the minimum density and a second correction output value in correspondence with the maximum density, and wherein the estimated ratio determining unit determines the first constant ratio for the first density range based on the first correction output value, the correction output value for the first reference density, and the modified correction output value for the first reference density, and determines the second constant ratio for the second density range based on the second correction output value, the correction output value for the second reference density, and the modified correction output value for the second reference density.

5. An image-forming device according to claim 1, wherein the correction input value estimating unit performs an interpolation calculation on the measured output values based on the reference output values to determine the correction input values that are assumed to produce the reference output values.

6. An image-forming device according to claim 1, wherein the image-forming unit further forms a maximum density patch by correcting the maximum density into a correction output value that corresponds to the maximum density in the correction table, the sensor detecting the density of the maximum density patch and outputting a measured output value for the maximum density, wherein the correction input value estimating unit estimates the correction input values for the reference densities based on the measured output values for the reference densities and for the maximum density.

7. A computer-implemented image-forming method comprising:

controlling an image-forming device, which is capable of forming for one color an image based on image data indicating a density falling within a predetermined density range, to form, for the one color, a plurality of density patches corresponding to a plurality of different reference densities, a plurality of different densities being defined within the density range and the plurality of different reference densities being defined among the plurality of densities within the density range;

detecting the densities of the density patches and obtaining a measured output value for each reference density;

determining reference ratios to compensate for differences between the measured output values and predetermined reference output values for the reference densities;

determining estimated ratios corresponding to densities other than the reference densities based on the reference ratios for the reference densities; and correcting density of image data based on the reference ratios and estimated ratios and controlling the image-forming unit to form an image based on the density-corrected image data;

wherein controlling the image-forming device corrects the plurality of reference densities by using a correction table that stores, for the one color, correction output values in correspondence with all the plurality of densities in the density range, the reference densities being corrected into correction output values that correspond to the reference densities in the correction table, and controls the image-forming device to form the plurality of density patches for the one color based on the corrected plurality of different reference densities;

wherein determining the reference ratio includes:

estimating, based on the measured output values and based on the reference output values, correction input values that are assumed to produce the reference output values;

determining, as a modified correction output value for each reference density, a correction output value that corresponds to the estimated correction input value in the correction table; and calculating, as the reference ratio for each reference density, a ratio between the correction output value that corresponds to the subject reference density in the correction table and the modified correction output value that corresponds to the estimated correction input value in the correction table, wherein correcting the density includes:

modifying the correction table by multiplying the correction output value for each reference density by the corresponding reference ratio and multiplying the correction output value for each density other than the reference densities in the density range by the corresponding estimated ratio; and correcting the density of the image data based on the modified correction table, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities, and wherein determining estimated ratios sets the estimated ratios for those densities that are other than the reference densities and that exist within a part of the density range that is defined between the first reverence density and the second reference density using a curve approximation based on the reference ratios calculated for the plurality of different reference densities.

8. A computer-implemented image-forming method according to claim 7, wherein estimating the correction input values performs an interpolation calculation on the measured output values based on the reference output values to determine the correction input values that are assumed to produce the reference output values.

9. A computer-implemented image-forming method according to claim 7, wherein the image-forming device is controlled to further form a maximum density patch by correcting the maximum density into a correction output value that corresponds to the maximum density in the correction table, the density of the maximum density patch being detected to obtain a measured output value for the maximum density, wherein estimating the correction input values estimates the correction input values for the reference densities based on the measured output values for the reference densities and for the maximum density.

10. A storage medium storing a set of program instructions executable on a data processing device, the instructions comprising:

controlling an image-forming unit, which is capable of forming, for one color, an image based on image data indicating a density falling within a predetermined density range, to form, for the one color, a plurality of density patches corresponding to a plurality of different reference densities, the plurality of different reference densities falling within the density range;

controlling a sensor to detect the densities of the density patches and to obtain a measured output value for each reference density;

determining reference ratios to compensate for differences between the measured output values and predetermined reference output values for the reference densities;

determining estimated ratios corresponding to densities other than the reference densities based on the reference ratios for the reference densities; and correcting density of image data based on the reference ratios and estimated ratios and controlling the image-forming unit to form an image based on the density-corrected image data;

wherein controlling the image-forming unit corrects the plurality of reference densities by using a correction table that stores for the one color correction output values in correspondence with all the plurality of densities in the density range, the reference densities being corrected into correction output values that correspond to the reference densities in the correction table, and controls the image-forming unit to form the plurality of density patches for the one color based on the corrected plurality of different reference densities;

wherein determining the reference ratio includes:

estimating, based on the measured output values and based on the reference output values, correction input values that are assumed to produce the reference output values;

determining, as a modified correction output value for each reference density, a correction output value that corresponds to the estimated correction input value in the correction table; and calculating, as the reference ratio for each reference density, a ratio between the correction output value that corresponds to the subject reference density in the correction table and the modified correction output value that corresponds to the estimated correction input value in the correction table, wherein correcting the density includes:

modifying the correction table by multiplying the correction output value for each reference density by the corresponding reference ratio and multiplying the correction output value for each density other than the reference densities in the density range by the corresponding estimated ratio; and correcting the density of the image data based on the modified correction table, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities, and wherein the determining estimate ratios sets the estimated ratios for those densities that are other than the reference densities and that exist within a part of the density range that is defined between the first reference density and the second reference density using a curve approximation based on the reference ratios calculated for the plurality of different reference densities.

11. A storage medium according to claim 10, wherein estimating the correction input values performs an interpolation calculation on the measured output values based on the reference output values to determine the correction input values that are assumed to produce the reference output values.

12. A storage medium according to claim 10, wherein the image-forming unit is controlled to further form a maximum density patch by correcting the maximum density into a correction output value that corresponds to the maximum density in the correction table, the sensor being controlled to detect the density of the maximum density patch to obtain a measured output value for the maximum density, wherein estimating the correction input values estimates the correction input values for the reference densities based on the measured output values for the reference densities and for the maximum density.

13. A correction data modifying device comprising:

a storing unit storing a correction table that stores for one color correction output values in correspondence with a plurality of different densities defined in a predetermined density range, and storing reference output values for a plurality of different reference densities, a plurality of densities being defined within the density range and the plurality of reference densities being defined among the plurality of densities within the density range;

a controlling unit correcting the plural different reference densities into correction output values that correspond to the reference densities in the correction table, and controlling an image-forming device, which is capable of forming for the one color an image based on image data indicating a density falling within the predetermined density range, to form for the one color a plurality of density patches for the plurality of different reference densities based on the corrected reference densities and to detect the densities of the density patches and output a measured output value for each reference density;

a reference ratio determining unit determining reference ratios to compensate for differences between the measured output values and the reference output values for the reference densities;

an estimated ratio determining unit determining estimated ratios corresponding to densities other than the reference densities based on the reference ratios for the reference densities; and a correction table modifying unit modifying the correction table by modifying the correction output values for the reference densities based on the reference ratios and by modifying the correction output values for densities other than the reference densities in the density range based on the estimated ratios;

wherein the reference ratio determining unit includes:

a correction input value estimating unit that estimates, based on the measured output values and based on the reference output values, correction input values that are assumed to produce the reference output values;

a modified correction output value determining unit that determines, as a modified correction output value for each reference density, a correction output value that corresponds to the estimated correction input value in the correction table; and a ratio calculating unit that sets, as the reference ratio for each reference density, a ratio between the correction output value that corresponds to the subject reference density in the correction table and the modified correction output value that corresponds to the estimated correction input value in the correction table, wherein the correction table modifying unit modifies the correction table by multiplying the correction output value for each reference density by the corresponding reference ratio and multiplying the correction output value for each density other than the reference densities in the density range by the corresponding estimated ratio, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities, and wherein the estimated ratio determining unit sets the estimated ratios for those densities that are other than the reference densities and that exist within a part of the density range that is defined between the first reference density and the second reference density using a curve approximation based on the reference ratios calculated for the plurality of different reference densities.

14. A correction data modifying device according to claim 13, further comprising a density correcting unit correcting density of image data based on the modified correction table and supplying the density-corrected image data to the image-forming device.

15. A correction data modifying device according to claim 13, wherein the reference densities are set at substantially a uniform interval within the density range.

16. A correction data modifying device according to claim 13, wherein the correction input value estimating unit performs an interpolation calculation on the measured output values based on the reference output values to determine the correction input values that are assumed to produce the reference output values.

17. A correction data modifying device according to claim 13, wherein the controlling unit controls the image-forming device to further form a maximum density patch by correcting the maximum density into a correction output value that corresponds to the maximum density in the correction table, and to detect the density of the maximum density patch and output a measured output value for the maximum density, wherein the correction input value estimating unit estimates the correction input values for the reference densities based on the measured output values for the reference densities and for the maximum density.

18. A correction data modifying device according to claim 13, wherein the estimated ratio determining unit sets a first constant ratio as the estimated ratio for a first density range below the first reference density, and sets a second constant ratio as the estimated ratio for a second density range above the second reference density.

19. A correction data modifying device according to claim 18, wherein the correction output values include a first correction output value in correspondence with the minimum density and a second correction output value in correspondence with the maximum density, and wherein the estimated ratio determining unit determines the first constant ratio for the first density range based on the first correction output value, the correction output value for the first reference density, and the modified correction output value for the first reference density, and determines the second constant ratio for the second density range based on the second correction output value, the correction output value for the second reference density, and the modified correction output value for the second reference density.

20. A computer-implemented correction data modifying method comprising:

using a correction table to correct a plurality of different reference densities into correction output values that correspond to the reference densities in the correction table, the correction table storing for one color correction output values in correspondence with a plurality of different densities defined in a predetermined density range, the plurality of different reference densities being defined among the plurality of densities;

controlling an image-forming device, which is capable of forming for the one color an image based on image data indicating a density falling within the predetermined density range, to form for the one color a plurality of density patches for the plurality of different reference densities based on the corrected reference densities;

detecting the densities of the density patches and obtaining a measured output value for each reference density;

determining reference ratios to compensate for differences between the measured output values and predetermined reference output values for the reference densities;

determining estimated ratios corresponding to densities other than the reference densities based on the reference ratios for the reference densities; and modifying the correction table by modifying the correction output values for the reference densities based on the reference ratios and by modifying the correction output values for densities other than the reference densities in the density range based on the estimated ratios;

wherein determining the reference ratio includes:

estimating, based on the measured output values and based on the reference output values, correction input values that are assumed to produce the reference output values;

determining, as a modified correction output value for each reference density, a correction output value that corresponds to the estimated correction input value in the correction table; and calculating, as the reference ratio for each reference density, a ratio between the correction output value that corresponds to the subject reference density in the correction table and the modified correction output value that corresponds to the estimated correction input value in the correction table, wherein modifying the correction table modifies the correction table by multiplying the correction output value for each reference density by the corresponding reference ratio and multiplying the correction output value for each density other than the reference densities in the density range by the corresponding estimated ratio, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities, and wherein determining estimated ratios sets the estimated ratios for those densities that are other than the reference densities and that exist within a part of the density range that is defined between the first reference density and the second reference density using a curve approximation based on the referenced ratios calculated for the plurality of different reference densities.

21. A computer-implemented correction data modifying method according to claim 20, wherein estimating the correction input values performs an interpolation calculation on the measured output values based on the reference output values to determine the correction input values that are assumed to produce the reference output values.

22. A computer-implemented correction data modifying method according to claim 20, wherein the image-forming device is controlled to further form a maximum density patch by correcting the maximum density into a correction output value that corresponds to the maximum density in the correction table, the density of the maximum density patch being detected to obtain a measured output value for the maximum density, wherein estimating the correction input values estimates the correction input values for the reference densities based on the measured output values for the reference densities and for the maximum density.

23. A storage medium storing a set of program instructions executable on a data processing device, the instructions comprising:

using a correction table to correct a plurality of different reference densities into correction output values that correspond to the reference densities in the correction table, the correction table storing for one color correction output values in correspondence with a plurality of different densities defined in a predetermined density range, the plurality of reference densities being defined among the plurality of densities;

controlling an image-forming device, which is capable of forming for the one color an image based on image data indicating a density falling within the predetermined density range, to form for the one color a plurality of density patches for the plurality of different reference densities based on the corrected reference densities;

controlling a sensor to detect the densities of the density patches and to output a measured output value for each reference density;

determining reference ratios to compensate for differences between the measured output, values and predetermined reference output values for the reference densities;

determining estimated ratios corresponding to densities other than the reference densities based on the reference ratios for the reference densities; and modifying the correction table by modifying the correction output values for the reference densities based on the reference ratios and by modifying the correction output values for densities other than the reference densities in the density range based on the estimated ratios;

wherein determining the reference ratio includes:

estimating, based on the measured output values and based on the reference output values, correction input values that are assumed to produce the reference output values;

determining, as a modified correction output value for each reference density, a correction output value that corresponds to the estimated correction input value in the correction table; and calculating, as the reference ratio for each reference density, a ratio between the correction output value that corresponds to the subject reference density in the correction table and the modified correction output value that corresponds to the estimated correction input value in the correction table, wherein modifying the correction table modifies the correction table by multiplying the correction output value for each reference density by the corresponding reference ratio and multiplying the correction output value for each density other than the reference densities in the density range by the corresponding estimated ratio, wherein the density range has a predetermined minimum density and a predetermined maximum density, the plurality of different reference densities being different from the predetermined minimum density and the predetermined maximum density, the plurality of different reference densities including a first reference density and a second reference density, the first reference density being different from but being the nearest to the minimum density among the plurality of different reference densities, the second reference density being different from but being the nearest to the maximum density among the plurality of different reference densities, and wherein determining estimated ratios sets the estimated ratios for those densities that are other than the reference densities and that exist within a part of the density range that is defined between the first reference density and the second reference density using a curve approximation based on the reference ratios calculated for the plurality of different reference densities.

24. A storage medium according to claim 23, wherein estimating the correction input values performs an interpolation calculation on the measured output values based on the reference output values to determine the correction input values that are assumed to produce the reference output values.

25. A storage medium according to claim 23, wherein the image-forming device is controlled to further form a maximum density patch by correcting the maximum density into a correction output value that corresponds to the maximum density in the correction table, the sensor being controlled to detect the density of the maximum density patch to obtain a measured output value for the maximum density, wherein estimating the correction input values estimates the correction input values for the reference densities based on the measured output values for the reference densities and for the maximum density.

* * * * *